TRANSISTOR SWITCH

Original Filed March 28, 1966

INVENTOR.
LELAND B. SMITH

BY A. M. Fernandez

ATTORNEY

United States Patent Office

3,538,349

Patented Nov. 3, 1970

3,538,349

TRANSISTOR SWITCH

Leland B. Smith, Whittier, Calif., assignor to Beckman Instruments, Inc., a corporation of California Continuation of application Ser. No. 537,994, Mar. 28, 1966. This application Oct. 27, 1969, Ser. No. 869,947

Int. Cl. H03k 17/00, 17/66

U.S. Cl. 307—238 2 Claims

ABSTRACT OF THE DISCLOSURE

An asynchronous sample and hold circuit including a bliateral current conducting switch for continuously coupling a bilevel digital input signal to a current driven bistable device to continuously sample the bilevel digital signal and means for opening the bilateral conducting switch at selected time intervals to disconnect the bilevel digital input signal from the bistable circuit whereby the bistable circuit stores or holds the last digital input signal sampled.

This is a continuation of application Ser. No. 537,994, filed Mar. 28, 1966, and now abandoned.

This invention relates in general to digital circuits for random sampling, and in particular to asynchronous switches for sampling and holding digital signals.

Sampling switches have been widely used in digital computers, such as at the interface between a computer and a system external to the computer. Typical applications for sampling switches are analog-to-digital conversions and digital-to-analog conversions, but the number of different applications for sampling switches is almost without limit; such switches are used whenever it is desired to transfer signals developed at one point to another point in a circuit or system. Accordingly, any mention or suggestion of a particular application is by way of example only.

In some applications it is desirable to implement a switch as a digital amplifier or as a digital storage element. A particular need has been for a simple switch with both gain and storage as well as high speed operation for sampling and holding digital signals. However, a switch which will function both as a digital amplifier and a digital storage element has not been implemented previously due to the complexities of such a switch and inherent limitations in the circuit design techniques available heretofore.

Accordingly, the primary object of this invention is to provide a digital sample and hold switch which is simple in design and has high speed capability. A further object is to provide a simple asynchronous switch for sampling and holding digital signals. Still another object is to provide a simple high speed switch with both amplification and digital storage capability.

These and other objects of the invention are achieved by providing a current-driven bistable device capable of being switched from one stable state to the other in response to a single bilevel digital input signal at one terminal according to the level of that signal, and selectively coupling an input terminal to which the digital signal is applied to that one terminal of the current-driven bistable device with a bilaterally conductive gate having a control terminal adapted to be connected to a source of control signals which shuts off current to and from the bistable device when a sample of the input signal is to be held. Operation is asynchronous and limited in speed by only the switching time of the bistable device which samples, amplifies and transmits the input signal until conduction through the gate is shut off, whereupon the last sample is stored, amplified and transmitted until conduction through the gate is again permitted. For signal preamplification and speed in operation, an active element having high current gain is employed in the gate coupling the input terminal to the one terminal of the current-driven bistable device, such as a field-effect transistor or a bilateral junction transistor. The bistable device comprises an active element at the output thereof for signal amplification.

The invention is described in the appended claims which form a part of this specification. However, for a better understanding of the invention and its advantages, reference should be made to the following detailed description and the accompanying drawing in which:

Figure 1:
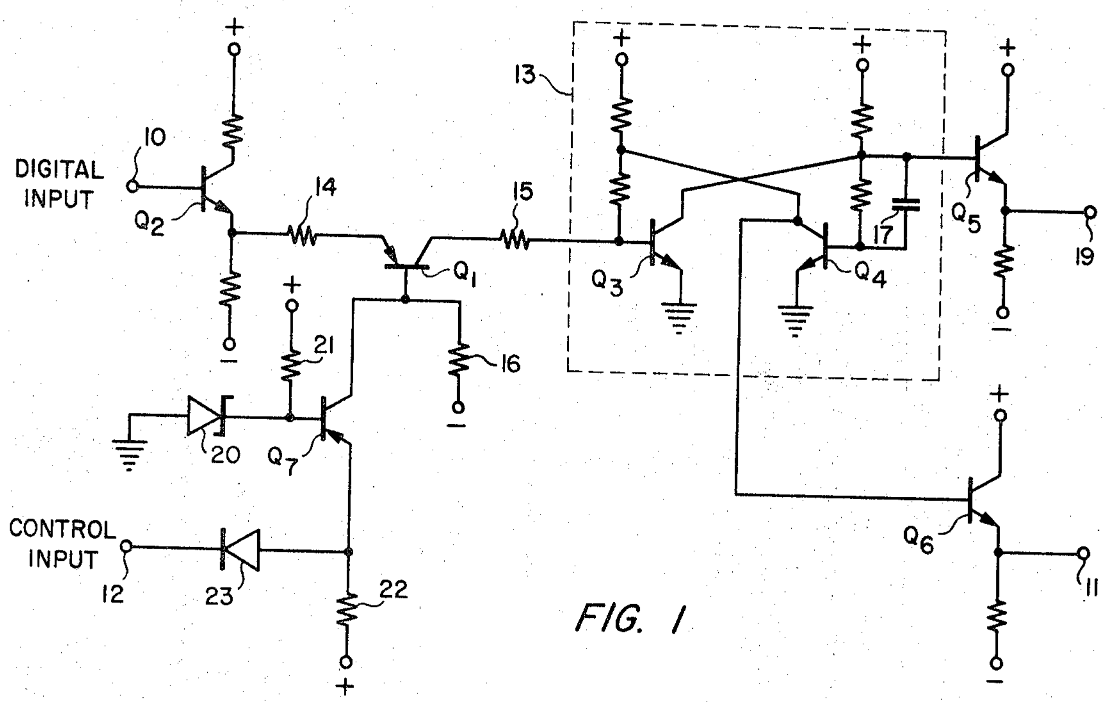
FIG. 1 is a schematic diagram of a preferred embodiment of the invention.

With reference to FIG. 1, a three-terminal solid-state asynchronous electronic switch is shown for for sampling a bilevel digital input signal at an input terminal 10, translating it to an output terminal 11 and, in response to a control signal at a terminal 12, holding the translated digital input signal at the output terminal 11 until the control signal at the terminal 12 is removed. Thus, the digital input signal is continuously sampled until an asynchronous control signal is received to hold the signal then being sampled, whereupon the last digital input signal sampled is held in a current-driven bistable device 13 until the control signal 12 is removed. In this preferred embodiment, the control signal is at about zero volts for the sample mode and at about +12 volts for the hold mode.

A bilateral transistor $Q_1$ such as a type 2N3640 is employed as the active element for transferring the digital input signal received at the input terminal 10 to the bistable device 13. The transfer function is that of a single-pole, single-throw switch in that when the transistor $Q_1$ is turned on, a bilaterally conductive path is provided therethrough. A second transistor $Q_2$ is provided as an emitter-follower stage to couple the input terminal 10 to the transistor switch $Q_1$. However, it should be understood that an emitter-follower stage need not be provided. A current limiting resistor 14 is connected in series between the emitter-follower and the transistor switch $Q_1$. A current limiting resistor 15 is also employed to couple the bistable device 13 to the transistor switch $Q_1$. A bias resistor 16 couples the base electrode of the transistor switch $Q_1$ to a source of negative potential so selected that the switch is normally conducting current to or from the bistable device depending upon the polarity of the signal at the input terminal 10.

The bistable device 13 may be any conventional current-operated, bistable device. In this preferred embodiment, it is a conventional flip-flop employing npn transistors $Q_3$ and $Q_4$ cross-coupled in the usual manner but employing a speed-up capacitor 17 in the cross-coupling circuit between the collector of the transistor $Q_3$ and the base of the transistor $Q_4$. To turn the transistor $Q_3$ on, current is provided not only from the collector of the transistor $Q_4$ but also from the switch $Q_1$; accordingly, a speed-up capacitor is not required in the cross-coupling circuit from the collector of the transistor $Q_4$ to the base of the transistor $Q_3$ to turn the transistor $Q_3$ on when the digital input signal becomes positive with the same speed that the transistor $Q_4$ is turned on when the input signal becomes negative. Zener diodes may be connected between ground and the collectors of the transistors $Q_3$ and $Q_4$ to prevent them from going more positive than about +6.2 volts, such as when grounded pnp transistors are to be switched directly from the output terminals, if the transistors have a reverse bias breakdown of about +5 volts. A complementary output is taken from an output terminal 19. Both output terminals 11 and 19 are coupled to the collectors of transistors $Q_3$ and $Q_4$ by emitter-follower stages $Q_5$ and $Q_6$.

The base of the switching transistor $Q_1$ is coupled to the control input terminal 12 by a switch control transistor $Q_7$. A Zener diode 20 and bias resistors 21, 22 are provided to maintain the transistor $Q_7$ conducting while the input terminal 12 is maintained at a potential more positive than the base of the transistor $Q_7$. A diode 23 is employed to couple the emitter of the transistor $Q_7$ to the control input terminal 12. Together with the transistor $Q_7$, it functions as a comparator. Such a comparator circuit offers the advantage of simplicity over a two-transistor comparator or differential amplifier where extremely low offset voltage is not required between the input and the output. Operation of the comparator is as follows when the resistor 22 is chosen so that the desired collector-to-emitter current is maintained with the base-emitter junction of the transistor $Q_7$ forward biased. The resistor 16 is chosen so that the transistor $Q_7$ remains in the linear region with its base-emitter junction forward biased. The diode 23 is preferably selected to be of the same material as the transistor $Q_7$ so that when the input control signal is very nearly the same as the reference voltage provided by the Zener diode 20, the transistor $Q_7$ will change states from cut off to conducting and from conducting to cut off, depending upon whether the control signal is more positive or more negative than the reference voltage.

In operation, while the control signal applied to the terminal 12 is at zero volts, the transistor $Q_7$ is maintained cut off. With the transistor $Q_7$ cut off, the negative bias potential applied through resistor 16 to the base of the switching transistor $Q_1$ maintains it in class A operation so that, as the bilevel digital input signal applied to input terminal 10 shifts between a negative and a positive potential, the current through the bilateral transistor $Q_1$ to the base of the transistor $Q_3$ reverses to turn the transistor $Q_3$ off and on, thereby providing a complementary output signal at the terminal 19 which shifts between +12 and 0 volts. Thus, as long as the transistor $Q_7$ is maintained cut off, the switching circuit functions as an inverting digital amplifier. If a non-inverting digital amplifier is desired, the output signal may be taken from the output terminal 11.

When the control signal is positive the transistor $Q_7$ is turned on. When the transistor $Q_7$ conducts, the base of the switching transistor $Q_1$ is driven to about +5 volts thereby cutting off conduction therethrough to hold the bistable device 13 in the last stable condition to which it was switched prior to receipt of the positive hold control signal at the terminal 12. Response to the hold control signal requires less than 50 nanoseconds. When the control signal returns to zero volts, the transistor $Q_7$ is cut off, and conduction through the bilateral transistor $Q_1$ is resumed. The complete cycle requires less than 0.1 microsecond.

Figure 2:
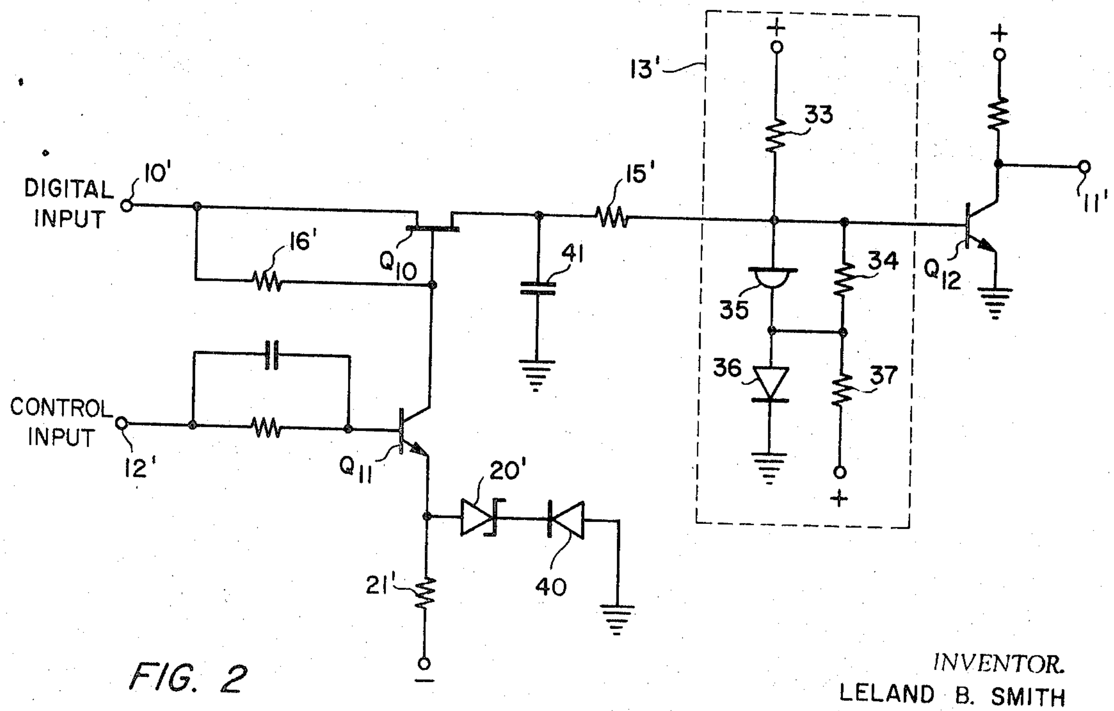
FIG. 2 illustrates a second embodiment of the invention.

The second embodiment of the invention illustrated in FIG. 2 uses a bilateral field-effect transistor $Q_{10}$ in place of the bilateral junction transistor $Q_1$ and FIG. 1, and to achieve a response to the control signal of less than 40 nanoseconds, a bistable device 13' comprising a tunnel diode circuit is employed instead of the transistor flip-flop of FIG. 1. However, it should be understood that the transistor flip-flop may be used in the embodiment of FIG. 2, and that the tunnel diode circuit may be employed in the embodiment of FIG. 1 with the same speed advantage.

Resistors 33 and 34 bias the tunnel diode 35 to operate in a bistable mode. A transistor amplifier $Q_{12}$ couples the output of the bistable device to the ouput treminal 11'. A diode 36 and a bias resistor 37 "bias up" the tunnel diode so that it will drive the npn silicon transistor $Q_{12}$. By that it is meant that the diode 36 is employed to provide a reference potential for the tunnel diode of approximately +0.75 volt since the emitter of the transistor $Q_{12}$ is connected directly to ground and, for the output transistor to conduct, its base must be more positive than the emitter by an amount greater than its base-to-emitter voltage drop, which is substantially the same as the voltage drop across the diode 36. Consequently, by biasing up the tunnel diode, only a small increase in the output potential from the tunnel diode is required as it is turned off to turn on the transistor $Q_{12}$. The diode also provides temperature tracking of the $V_{be}$ of the transistor $Q_{12}$, thereby providing temperature stability.

The tunnel diode bistable device 13' is a current controlled device. When a current which causes the tunnel diode bias current to be in excess of the tunnel diode "peak current" flows through resistor 15', the bistable device 13' switches to its high voltage state turning on the transistor $Q_{12}$. Conversely, when a current flows through the resistor 15' which causes the tunnel diode bias current to fall below the tunnel diode "valley current," the tunnel diode switches to its low voltage state, thereby turning off the transistor $Q_{12}$. To produce these currents through the resistor 15', the field-effect transistor $Q_{10}$ is held conducting, i.e., in its low impedance state. When the digital signal at the input terminal 10' is sufficiently positive with respect to the potential at the junction between the bias resistors 33 and 34, positive current to that junction switches the tunnel diode to its high voltage state. Conversely, when the digital signal at the input 10' is sufficiently negative, negative current through the resistor 15' switches the tunnel diode to its low voltage state.

The field-effect transistor $Q_{10}$ is held conductive by holding a switch control transistor $Q_{11}$ cut off in response to a negative signal at a control terminal 12' that is sufficiently negative to reverse bias the base-to-emitter junction of the transistor $Q_{11}$. The gate of the field-effect transistor $Q_{10}$ is then shorted to its source by a resistor 16' to bias it on and allow the digital input signal to be continuously sampled by the bistable device 13'. It should be noted that the digital output at terminal 11' is the complement of the digital input: while the digital input is positive, the digital output is zero volts, and while the digital input is negative, the digital output is positive.

When the control signal at the terminal 12' is driven sufficiently positive, the transistor $Q_{11}$ is turned on and the gate of the field-effect transistor $Q_{10}$ is thereby clamped to a negative "pinch-off" potential to switch it off, i.e., to a high impedance state. The high impedance of the field-effect transistor $Q_{10}$ in series with the current limiting resistor 15' prevents the flow of sufficient current of either polarity to change the state of the bistable device 13', thus holding the digital signal sampled last in the bistable device 13'.

Bias for the switch control transistor $Q_{11}$ is provided by a Zener diode 20' and a resistor 21' connected to the emitter thereof. A diode 40 is connected in series with the Zener diode 20' in order to increase the negative bias on the emitter of the transistor $Q_{11}$ by the amount of its voltage drop. Thus, the control signal applied to the terminal 12' may be zero volts to turn the switching transistor $Q_{11}$ on and −12 volts to turn it off.

For high-speed operation, a capacitor 41 is connected between the drain of the field-effect transistor $Q_{10}$ and ground to thereby shunt transients from the voltage transitions at the digital input terminal 10' and at the gate of the transistor $Q_{10}$ which are coupled to the drain of the transistor $Q_{10}$ by its capacitance. Thus, the high-speed capabilities of all of the active components are used to advantage. The field-effect transistor $Q_{10}$ can operate under bipolar conditions allowing a simplification of its bias circuit.

Although an n-type junction transistor is shown in the embodiment of FIG. 1 and a n-type field-effect transistor in the embodiment of FIG. 2, it should be noted that p-type transistors may be employed instead in each of the two embodiments by simply adjusting the bias on the base electrode of the junction transistor $Q_1$ in the embodiment of FIG. 1 and the associated control switch comprising the transistor $Q_7$, and by simply reversing the polarity of the bias for the gate in the embodiment of FIG. 2.

What is claimed is:

1. An asynchronous high speed speed switch for sampling and holding a bilevel digital input signal comprising:

a tunnel diode capable of being switched at high speeds from one stable state to a second stable state in response to the bilevel digital signal;

an input terminal upon which the bilevel digital signal is impressed;

a field effect transistor connected between said input terminal and said tunnel diode for continuously coupling said bilevel digital signal to said tunnel diode whereby said tunnel diode continuously samples said bilevel digital signal;

a source of control signals; and means connected to said source of control signals for selectively applying a control signal to the gate terminal of said field effect transistor for driving said field effect transistor into nonconduction to shut off current flow between said input terminal and said tunnel diode whereby said tunnel diode is held in one of its stable states to store the last sample of said bilevel digital signal.

2. An asynchronous high speed switch as defined in claim 1 wherein said field effect transistor is bilaterally conductive.

References Cited

UNITED STATES PATENTS

| | | | |
|---|---|---|---|
| 3,192,407 | 6/1965 | Jorgensen | 307—293 XR |
| 3,231,763 | 1/1966 | Mellott | 307—238 |
| 3,327,133 | 6/1967 | Sickles | 307—249 XR |
| 3,414,737 | 12/1968 | Bowers | 307—251 XR |
| 3,020,418 | 2/1962 | Emile | 307—238 |
| 3,192,407 | 6/1965 | Jorgensen | 307—293 XR |

JOHN S. HEYMAN, Primary Examiner

J. ZAZWORSKY, Assistant Examiner

U.S. Cl. X.R.

307—251, 286, 304